United States Patent
Kodama

(10) Patent No.: US 6,607,989 B2
(45) Date of Patent: Aug. 19, 2003

(54) METHOD FOR FORMING AN INTERCONNECT PATTERN IN A SEMICONDUCTOR DEVICE

(75) Inventor: Eisuke Kodama, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/059,647

(22) Filed: Jan. 29, 2002

(65) Prior Publication Data

US 2002/0142614 A1 Oct. 3, 2002

(30) Foreign Application Priority Data

Jan. 30, 2001 (JP) .................................. 2001-020905

(51) Int. Cl.⁷ ................. H01L 21/302; H01L 21/461
(52) U.S. Cl. ......................................................... 438/720
(58) Field of Search .................................. 438/720, 721, 438/710, 692, 648, 798

(56) References Cited

U.S. PATENT DOCUMENTS 5,252,382 A * 10/1993 Li ................................. 428/209
5,499,754 A * 3/1996 Bobbio et al. ................. 228/42
5,565,707 A * 10/1996 Colgan et al. ............... 257/762
5,904,154 A * 5/1999 Chien et al. ................. 134/1.2
6,033,990 A * 3/2000 Kishimoto et al. .......... 438/710
6,136,680 A * 10/2000 Lai et al. ..................... 438/597
6,150,257 A * 11/2000 Yin et al. ..................... 438/622

OTHER PUBLICATIONS

Sandhu et al. "Titanium electroconductive interconnects . . ." Derwent Abstracted Publication No. WO 9843284A. Oct. 20, 1998.*

* cited by examiner

Primary Examiner—Craig Thompson
(74) Attorney, Agent, or Firm—Hayes Soloway P.C.

(57) ABSTRACT

A method of forming an interconnect pattern in a semiconductor device includes the steps of pre-treating an interconnect layer, forming a photoresist pattern on the interconnect layer, heat treating the interconnect layer at a temperature between 280° C. and 400° C., and patterning the interconnect layer to form an interconnect pattern. The heat treatment re-distributes Cu particles segregated in the Al—Cu alloy layer during the $O_2$-plasma pretreatment, preventing occurrence of a short-circuit failure.

10 Claims, 10 Drawing Sheets

METHOD FOR FORMING AN INTERCONNECT PATTERN IN A SEMICONDUCTOR DEVICE

BACKGROUND OF THE INVENTION (a) Field of the Invention

The present invention relates to a method for forming an interconnect pattern in a semiconductor device and, more particularly, to a method suitable for forming a fine interconnect pattern having less short-circuit failure.

(b) Description of the Related Art

In a process for forming an interconnect structure in a semiconductor device, an Al—Cu alloy is generally used for the interconnect pattern. In a typical example, Al—Cu alloy includes 99.5% Al and 0.5% Cu at a weight ratio.

FIGS. 1A to 1E show consecutive steps of a conventional process for forming an interconnect pattern having the Al—Cu alloy. In FIG. 1A, on an underlying insulator layer 12 such as a $SiO_2$ film, a Ti/TiN film 14 including a Ti layer and a TiN layer is deposited as an adhesion/barrier layer by using a sputtering technique etc, followed by depositing an Al—Cu alloy layer 16 thereon by using a sputtering technique etc.

Subsequently, as shown in FIG. 1B. a TiN/Ti film 18 is deposited on the Al—Cu alloy layer 16 by a sputtering technique etc., thereby obtaining a combination interconnect layer 20 including the Ti/TiN film 14, the Al—Cu alloy layer 16 and the TiN/Ti film 18.

Thereafter, as shown in FIG. 1C, the Ti/TiN film 18 is subjected to an $O_2$-plasma treatment as a pretreatment for patterning the combination interconnect layer 20.

Subsequently, as shown in FIG. 1D, a photoresist mask 22 having a design interconnect pattern is formed on the TiN/Ti film 18, followed by patterning the combination interconnect layer 20 by using a plasma-enhanced etching technique using the photoresist mask 22 as an etching mask. Thus, an interconnect pattern 24 is obtained which includes the Ti/TiN film 14, the Al—Cu alloy layer 16 and the TiN/Ti film 18 consecutively formed on the underlying insulator layer 12.

In the conventional technique as described above, the possibility of a short-circuit failure occurring in the interconnect pattern increases together with the development of a finer design rule and higher integration in the semiconductor device, both of which involve a smaller line gap in the interconnect pattern.

The short-circuit failure degrades the product yield of the semiconductor devices, and thus a method for forming the interconnect pattern free from such a failure has long been desired.

SUMMARY OF THE INVENTION

In view of the above problem in the conventional technique, it is an object of the present invention to provide a method for forming a fine interconnect pattern in a semiconductor device, which is capable of forming an interconnect pattern having less short-circuit failure.

The present invention provides a method for forming an interconnect pattern including the consecutive steps of: depositing an interconnect film including at least an Al—Cu alloy layer on an underlying layer; plasma treating the interconnect film; heat-treating the interconnect film at a temperature between 280° C. and 400° C.; and patterning the interconnect film by using an etching mask to form the interconnect pattern.

The heat treating of the interconnect film at the specified temperature after the plasma treatment, such as an $O_2$-plasma or Ar-plasma treatment, re-distributes the Cu particles which occur within the Al—Cu alloy layer during the plasma treatment, thereby suppressing the short-circuit failure caused by the Cu particles in the resultant interconnect pattern.

The above and other objects, features and advantages of the present invention will be more apparent from the following description, referring to the accompanying drawings.

PREFERRED EMBODIMENTS OF THE INVENTION

Before describing the embodiment of the present invention, findings by the inventor and the principle of the present invention will be described in connection with the experiments for a better understanding of the present invention.

Figure 1A:
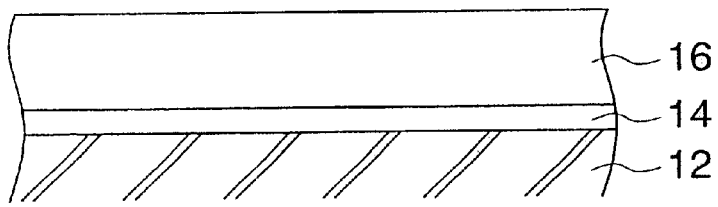
FIGS. 1A to 1E are sectional views of a semiconductor device, showing consecutive steps of a conventional process for forming an interconnect structure.
Figure 1B:
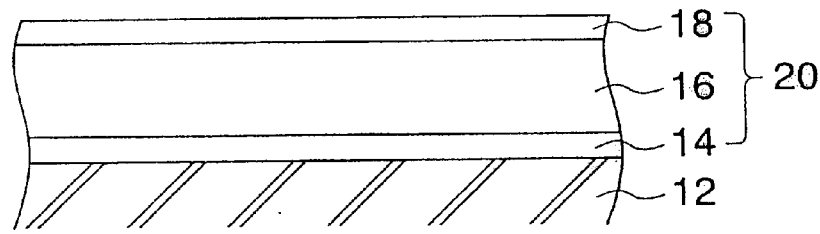
Figure 1C:
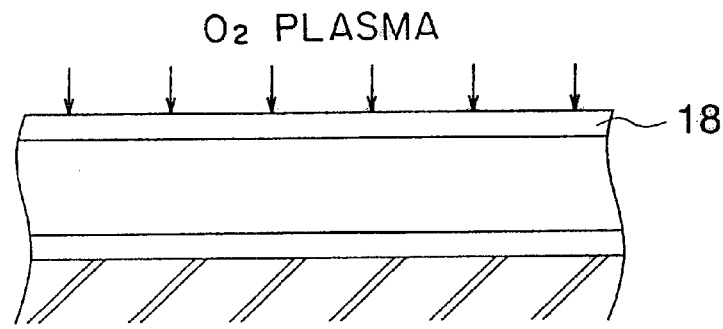
Figure 1D:
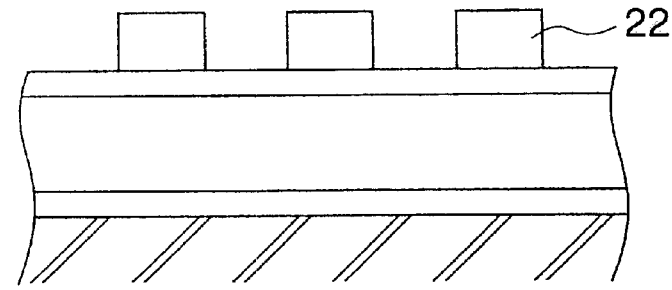
Figure 1E:
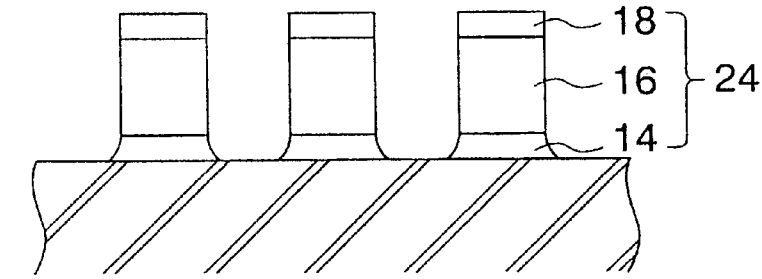
Figure 2:
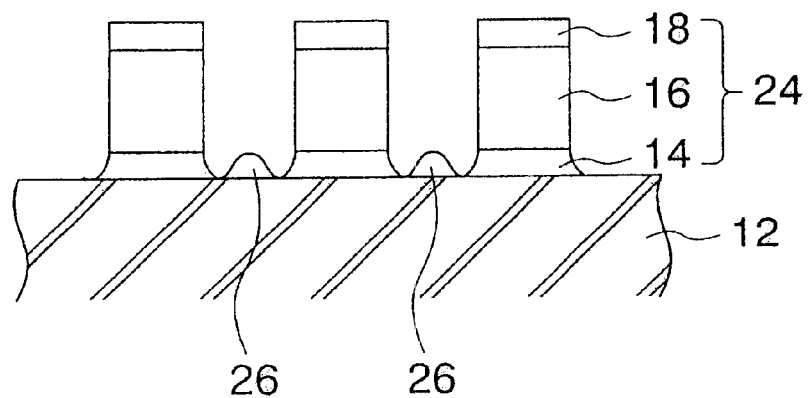
FIG. 2 is a sectional view of the semiconductor device fabricated by the process of FIGS. 1A to 1E, showing a defect therein.

It is noted by the inventor that a short-circuit failure occurring between interconnect lines in a semiconductor device is caused by a specific temperature condition of the Al—Cu alloy layer which segregates the Cu atoms in the Al—Cu alloy layer to form fine Cu particles. The fine Cu particles, as shown in FIG. 2, have a tendency to remain on the underlying insulator layer 12 as Cu conglomerates 26 after the etching of the Al—Cu alloy layer 16 for forming the interconnect pattern 24, due to the difference in the etch rate between the Al—Cu alloy layer 16 and the segregated Cu particles. The remaining Cu conglomerates 26 often bridge adjacent interconnect lines 24 to cause the short-circuit failure in the resultant semiconductor device.

It is also found that the temperature of the Al—Cu alloy layer 16 is raised up to the above specific temperature condition during deposition of the Al—Cu alloy layer 16, deposition of the TiN/Ti layer 18, $O_2$-plasma pretreatment and replacement of the etching mask, whereby the Cu particles are segregated within the Al—Cu alloy layer.

The inventor conducted the experiments, as detailed hereinafter, to confirm the specific temperature condition causing the Cu segregation and to solve the problem by re-distributing the segregated Cu particles within the Al—Cu alloy layer, using a heat treatment before patterning the combination interconnect layer.

Experiment 1

A sample wafer was subjected to a heat treatment while examining the influence by the heat treatment. The sample wafer has a configuration such that:

the underlying layer was made of $SiO_2$;

the thickness of the lower TiN layer was 300 angstroms;

the thickness of the lower Ti layer was 400 angstroms;

the lower Ti/TiN film was formed at a temperature of 300° C.;

the thickness of the Al—Cu alloy layer was 5000 angstroms;

the thickness of the upper Ti layer was 250 angstroms;

the thickness of the upper TiN layer was 500 angstroms; and the Al—Cu alloy layer, the upper Ti layer and the upper TiN layer were formed at a temperature of 310° C.

In this experiment, the sample wafer is subjected to Ar-annealing at a temperature of 250° C. for ten minutes, subjected to an $O_2$-plasma pretreatment, coated by a photoresist film having a thickness of 9,000 angstroms, subjected to exposure and development for patterning the photoresist film to obtain an etching mask therefrom, and subjected to plasma-enhanced etching for patterning the combination interconnect layer in this order.

The conditions of the $O_2$-plasma pretreatment were as follows:

ambient pressure at 1.1 Torr;

flow rate of $O_2$ at 3500 sccm;

plasma power at 1400 watts;

temperature at 240° C.; and treatment time for 30 seconds.

The conditions of the plasma etching for patterning the interconnect layer were as follows:

ambient pressure at 1.5 Pa;

flow rates of $Cl_2$, $BCl_3$, Ar containing 10% $CH_4$, and Ar at 110 sccm, 50 sccm, 96 sccm, and 144 sccm, respectively;

plasma power at 600 watts;

temperature at 40° C.; and etching time for 170 seconds.

Figure 3:
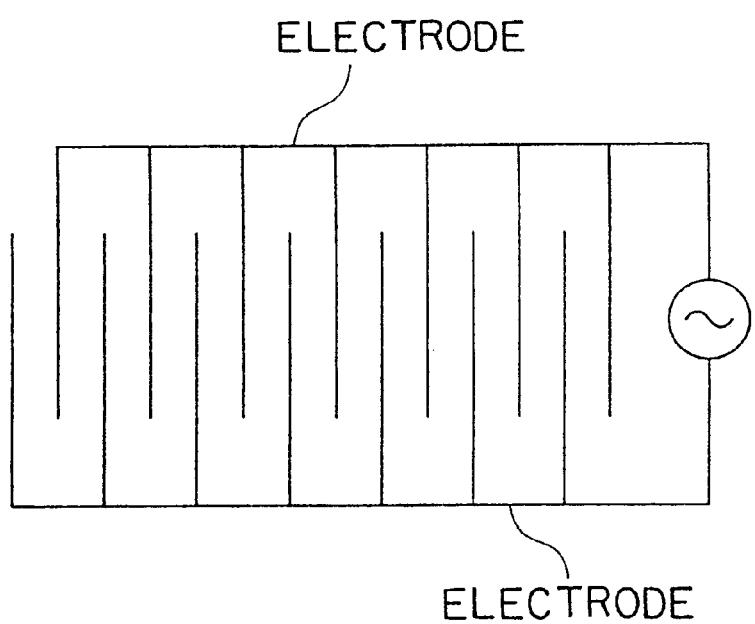
FIG. 3 is a circuit diagram of a short-circuit test for the interconnect pattern in each of sample wafers.

A short-circuit test for detecting a short-circuit failure was conducted to each of the chips obtained from the sample wafer, which test revealed that all of the chips had short-circuit failures in the interconnect patterns therein. The interconnect layer is configured such that the resultant interconnect layer had a pair of comb-shape electrodes, between which a test voltage was applied in the test, as shown in FIG. 3, while measuring the current flowing across the electrodes for detecting a short-circuit failure.

Figure 4A:
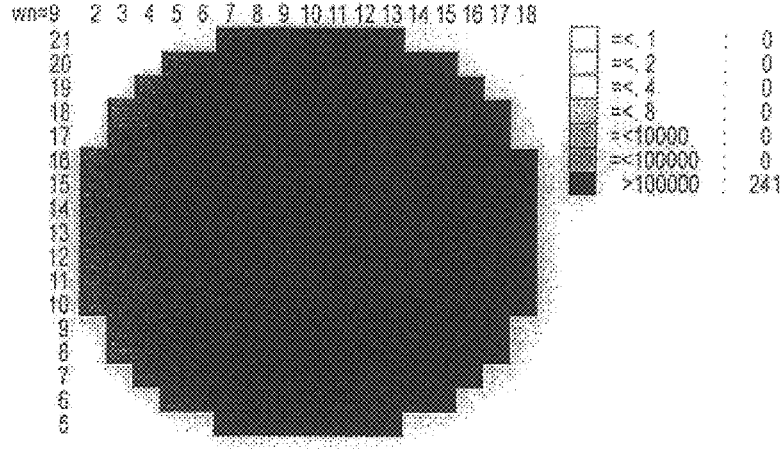
FIGS. 4A to 4C are schematic top plan views of sample wafers in Examples 1 and 2, showing defective chips each having a short-circuit failure compared to a comparative sample.

The test results are shown in FIG. 4A, wherein the chips each exhibiting a specified measured current are marked on the sample wafer for each specified measured current, and the number of the chips having the each specified measured current is shown at the right side. This is similar in FIGS. 4B and 4C as well as the drawings to follow. In FIG. 4A, it is shown that all the chips had a current above 100,000 pA, revealing occurrence of the short-circuit failure.

Figure 4B:
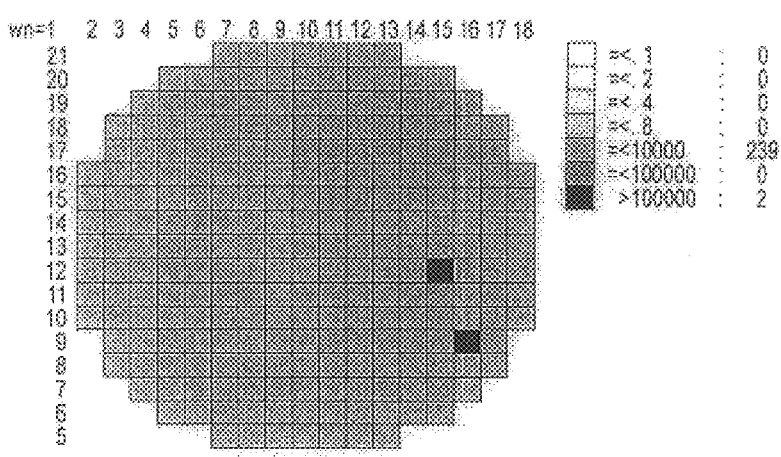

A similar test was conducted to another sample wafer, which had a configuration similar to the above configuration and was formed by a process similar to the above process except that the another sample was not subjected to the Ar annealing. FIG. 4B shows the test results for the another sample wafer. All the chips exhibited a measured current between 0.8 pA and 10,000 pA, which means there is no short-circuit failure, except for two chips which had short-circuit failures.

Experiment 2

Figure 4C:
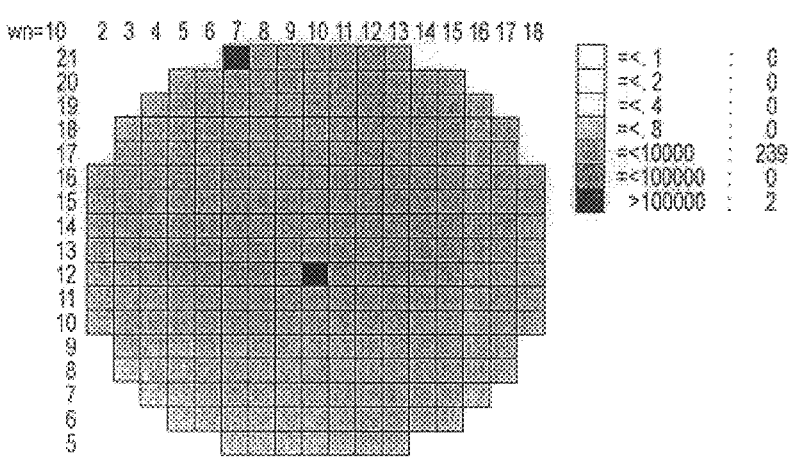

In this experiment, a sample wafer had a configuration similar to the configuration of the sample wafer of Experiment 1 and was formed by a process similar to the above process expect that the sample wafer of Experiment 2 was subjected to another Ar-annealing at 350° C. for ten minutes following an Ar-annealing similar to that in Experiment 1. More specifically, this sample wafer was subjected consecutively to an $O_2$-plasma treatment, first Ar-annealing, second Ar-annealing at 350° C. for ten minutes, and a photolithographic etching step for patterning. The resultant wafer is subjected to testing the interconnect structure in each of the chips therein. The test results are shown in FIG. 4C, which reveals that the test results were substantially similar to the test results shown in FIG. 4B.

It is considered from the results of Experiment 2 that the second Ar-annealing at 350° C. re-distributed the Cu particles segregated by the first Ar-annealing at 250° C. within the Al—Cu alloy layer, thereby suppressing the short-circuit failure in the resultant interconnect pattern.

Other sample wafers which had a configuration similar to that in Experiment 2 were manufactured by processes similar to that in Experiment 2 except for the second Ar-annealing steps, which were conducted at temperatures 280° C., 300° C., 320° C., 340° C., 360° C., 380° C. and 400° C. for respective other sample wafers. The test results for the short-circuit tests in the other sample wafers were similar to those in the sample wafer of Experiment 2.

Experiments 3 to 5

Sample wafers of these experiments had configurations similar to the sample of Experiment 1 and were manufactured by a process similar to the process of Experiment 1 except for an absence of the Ar-annealing and the conditions in the $O_2$-plasma treatments. The conditions in the $O_2$-plasma treatments are tabulated in the following table.

TABLE 1

|  | Ex. 3 | Ex. 4 | Ex. 5 |
| --- | --- | --- | --- |
| Pressure (Torr) | 1.1 | 1.1 | 1.1 |
| $O_2$ flow rate (sccm) | 3750 | 3750 | 3750 |
| Plasma power (watts) | 1000 | 1000 | 1000 |
| Temperature (° C.) | 150 | 200 | 250 |
| Time length (seconds) | 45 | 45 | 45 |

Figure 5A:
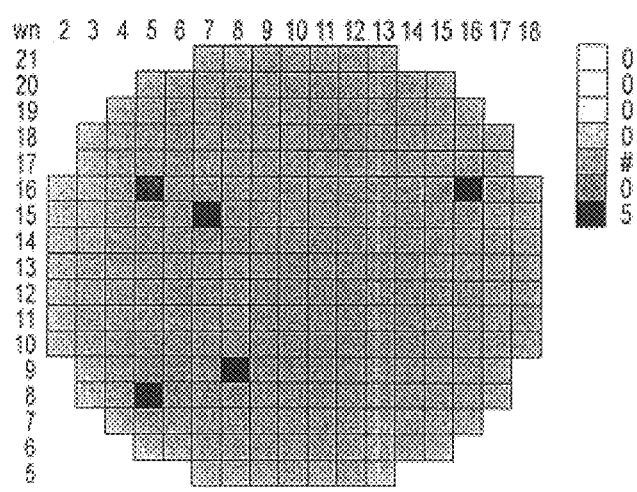
FIGS. 5A to 5C are schematic top plan views of sample wafers in Examples 3 to 5, showing defective chips each having a it short-circuit failure compared to a comparative sample.
Figure 5B:
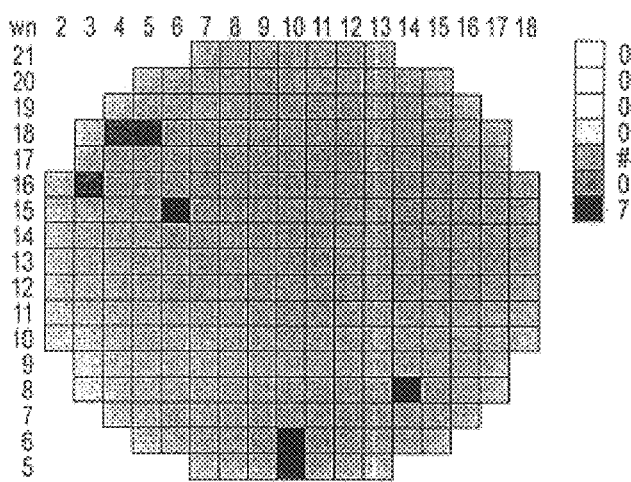
Figure 5C:
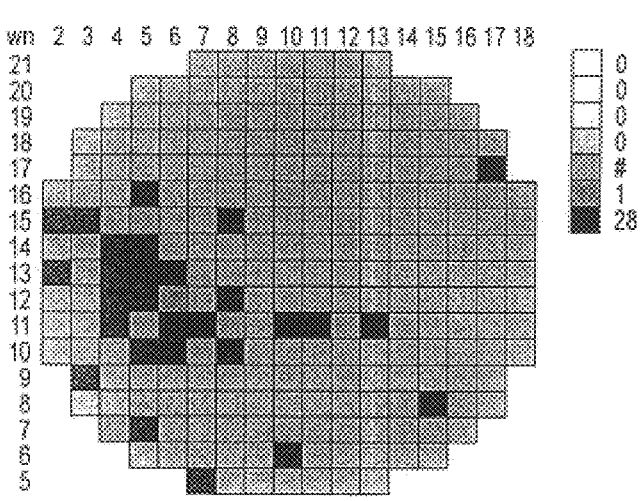

The test results for the sample wafers are shown in FIGS. 5A, 5B and 5C corresponding to Experiments 3, 4 and 5, respectively.

From FIGS. 5A, 5B and 5C, it may be concluded that the $O_2$-plasma treatment at 250° C. causes a higher possibility of the short-circuit failure as in the case of Experiment 5, and that temperature of 200° C. or below for the $O_2$-plasma treatment provides a significantly lower possibility of the short-circuit failure as in the case of Experiments 3 and 4.

Experiments 6 and 7

Each of sample wafers of these experiments, which had a configuration similar that of sample wafer of Experiment 1, was manufactured by a process similar to that for the sample wafer of Experiment 1 except for an additional Ar-plasma treatment conducted subsequent to the $O_2$-plasma treatment. The additional Ar-plasma treatments for Experiments 5 and 6 were conducted at temperatures of 250° C. and 350° C., respectively, for ten minutes. The results of the short-circuit tests are shown in FIGS. 6A and 6B corresponding to Experiments 6 and 7, respectively.

Figure 6A:
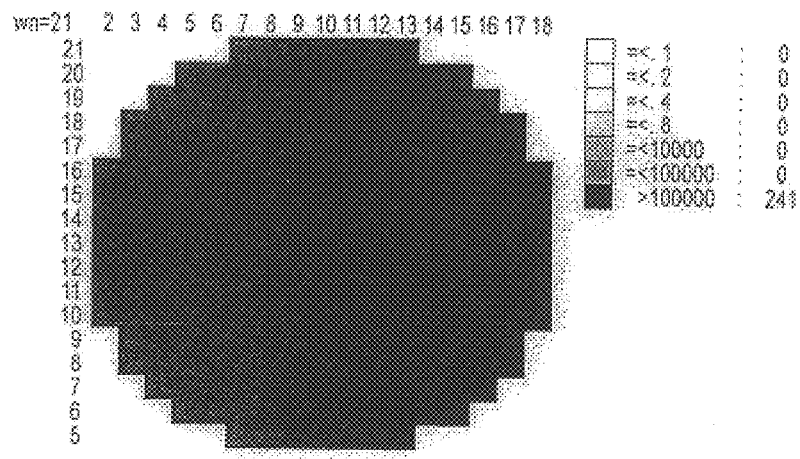
FIGS. 6A and 6B are schematic top plan views of sample wafers in Examples 6 and 7, showing defective chips each having a short-circuit failure compared to a comparative sample.
Figure 6B:
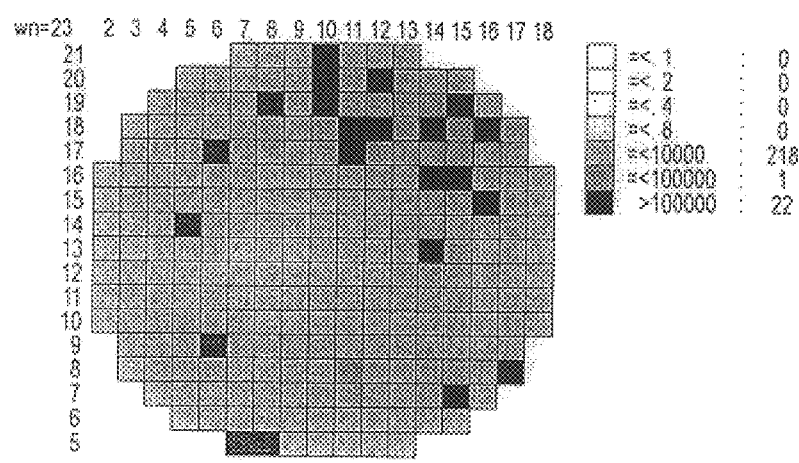

FIGS. 6A and 6B show that the Ar-plasma treatment at 250° C. causes short-circuit failures in all the chips, and that the Ar-treatment at 350° C. causes a significantly less possibility of the short-circuit failure.

Experiments 8 and 9

Sample wafers of these experiments had configurations similar to that of the sample wafer of Experiment 1 and were manufactured by a process similar to that for Experiment 1 except for the conditions in the $O_2$-plasma treatments and additional processings for replacement of the photoresist masks. The conditions in the $O_2$-plasma treatments are tabulated in the following table.

TABLE 2

|  | First condition | Second condition |
| --- | --- | --- |
| Pressure (Torr) | 1.1 | 1.1 |
| $O_2$ flow rate (sccm) | 3500 | 3500 |
| Plasma power (watts) | 1400 | 1400 |
| Temperature (° C.) | 240 | 200 |
| Time length (seconds) | 30 | 20 |

The processing for the sample of Experiment 8 included: an ordinary processing including the steps of $O_2$-plasma treatment using the first condition, coating photoresist, and patterning thereof to form a photoresist mask; and three-time additional processing, the additional processing including each time the steps of removing the photoresist mask, an $O_2$-plasma treatment using the second condition and forming another photoresist mask, prior to patterning the combination interconnect pattern. The processing for the sample of Experiment 9 was similar to the sample of Experiment 8 except for the number of times of the additional processing, which is five instead of three.

Figure 7A:
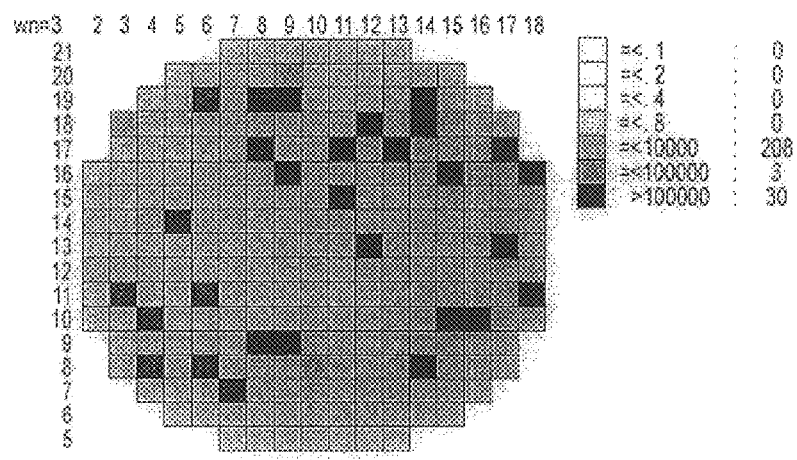
FIGS. 7A to 7C are schematic top plan views of sample wafers in Examples 8 and 9, showing defective chips each having a short-circuit failure compared to a comparative sample.
Figure 7B:
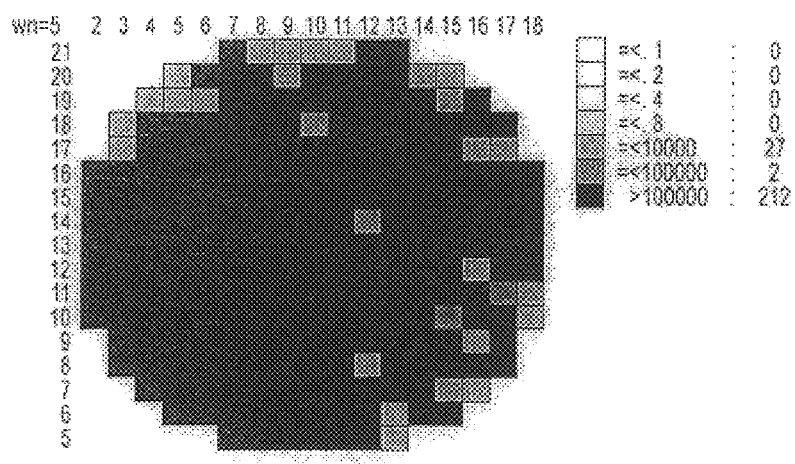
Figure 7C:
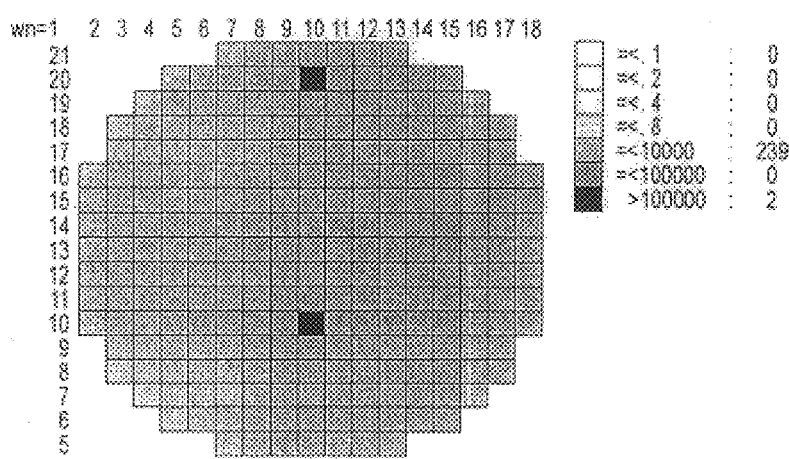

The test results for Experiments 8 and 9 are shown in FIGS. 7A and 7B, respectively. FIG. 7C also shows the test results of a comparative sample wafer for which the additional processing is omitted from the processings for Experiments 8 and 9.

As understood from FIGS. 7A, 7B and 7C, it is confirmed that iterative additional processing including the replacement of the mask pattern and the $O_2$-plasma treatment increases the number of chips which suffer from the short-circuit failure and especially almost all the chips suffer from the short-circuit failure if the additional processing is conducted five times. It is considered therefrom that the Cu segregation occurs due to the temperature rise of the wafer up to a temperature between 200° C. and 240° C., causing the short-circuit failure.

Experiments 10 and 11

Sample wafers of these experiments had configurations similar to that of the sample of Experiment 1 and were manufactured by a process similar to that for Experiment 1 except for the conditions in the $O_2$-plasma treatments and additional processings including the $O_2$-plasma treatments. The conditions in the $O_2$-plasma treatments are tabulated in the following table.

TABLE 3

|  | First condition | Second condition |
| --- | --- | --- |
| Pressure (Torr) | 1.1 | 1.1 |
| $O_2$ flow rate (sccm) | 3500 | 3500 |
| Plasma power (watts) | 1400 | 1400 |
| Temperature (° C.) | 240 | 150 |
| Time length (seconds) | 30 | 20 |

The processing for the sample of Experiment 10 included: an ordinary processing including the steps of $O_2$-plasma treatment using the first condition, coating photoresist, and patterning thereof to form a photoresist mask; and three-time additional processing, the additional processing including each time the steps of removing the photoresist mask, an $O_2$-plasma treatment using the second condition and forming another photoresist mask, prior to patterning the combination interconnect pattern.

The processing for the sample of Experiment 11 was similar to the sample of Experiment 10 except for the number of times of the additional processing, which is five instead of three. Other steps for Experiments 10 and 11 were similar to those in Experiment 1 except that the etching step used methane as an additive.

Figure 8A:
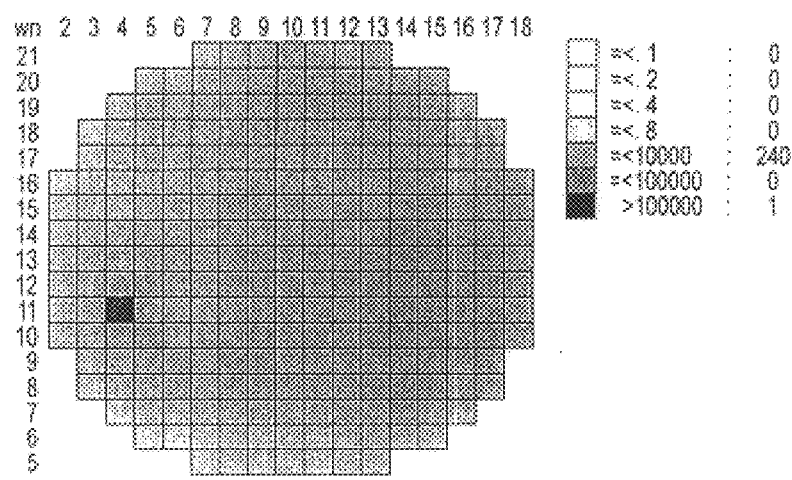
FIGS. 8A to 8C are schematic top plan views of sample wafers in Examples 10 and 11, showing defective chips each having a short-circuit failure compared to a comparative sample.
Figure 8B:
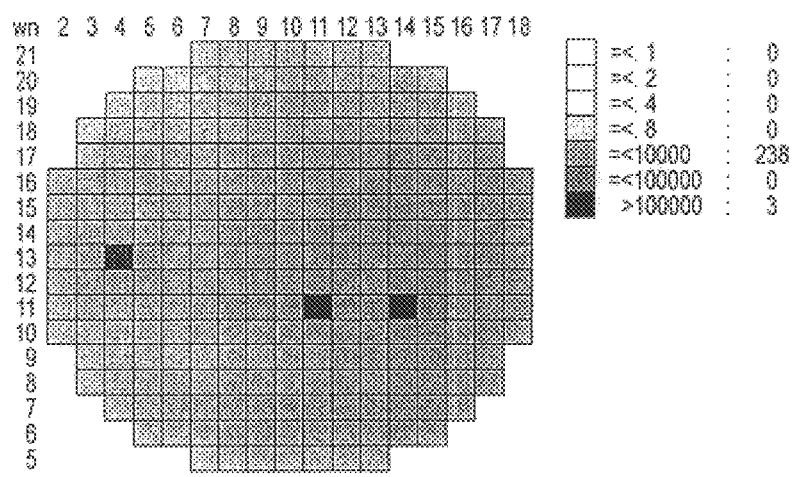
Figure 8C:
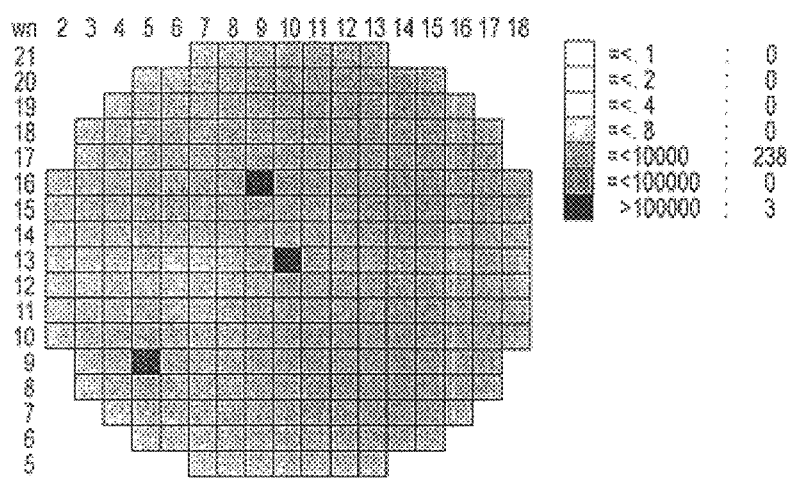

The test results for Experiments 10 and 11 are shown in FIGS. 8A and 8B, respectively. FIG. 8C also shows the test results of a comparative sample for which the additional processing is omitted after the $O_2$-plasma treatment using the first condition from the processings for Experiments 10 and 11.

As understood from FIGS. 8A, 8B and 8C, it is confirmed that iterative additional processing including the steps of forming and removing the mask pattern and the $O_2$-plasma treatment does not increase the number of chips which suffer from the short-circuit failure, so long as the $O_2$-plasma treatment uses a temperature of 150° C. More specifically, the additional processing including the $O_2$-plasma treatment at a temperature of 150° C. or lower does not involve the Cu segregation.

Thus, it is considered from above Experiments 1 to 11 that a heat treatment at a temperature between 280° C. and 400°

C. after the $O_2$-plasma treatment can remove the Cu segregation within the Al—Cu alloy layer, and that the occurrence of the Cu segregation within the Al—Cu alloy layer is significantly suppressed by the additional processing including the step of removing the etching mask by using an ashing step at a temperature of 200° C. or below and the $O_2$-plasma treatment for the combination interconnect layer at a temperature of 150° C or below, if the replacement of the photoresist mask is desired.

In the present invention, the interconnect layer is not limited to the specific combination interconnect layer, so long as the interconnect layer includes Al—Cu alloy as a main component thereof. In a practical example, it is preferable that the interconnect layer include an Al—Cu alloy layer, and a combination metallic film including an metallic adhesion layer and a metallic barrier layer on each of the bottom and the top surfaces of the Al—Cu alloy layer. The metallic adhesion layer may be a TiN layer and the metallic barrier layer may be a Ti layer, for example.

In the present invention, the heat treatment at a temperature between 280° C. and 400° C. conducted between the step of $O_2$-plasma treatment and the step of patterning the interconnect layer allows the Cu particles segregated within the Al—Cu alloy layer in the $O_2$-plasma treatment to re-distribute within the Al—Cu alloy layer, whereby the short-circuit failure due to the Cu segregation is suppressed.

It is preferable that an ashing step at a temperature of 200° C. or below be used for removing the etching mask and an $O_2$-plasma treatment at a temperature of 150° C. or below be used for the interconnect layer, if the etching mask is to be replaced by another etching mask, that is, an iterative steps for forming and removing an etching mask are conducted, such as in the case of misalignment or defect of the etching mask.

A heat treatment system to be used in the present invention for the above heat treatment may be of any type such as installed in a wafer stage, a reactor or a plasma chamber.

Now, the present invention is more specifically described with reference to preferred embodiment thereof.

Figure 9A:
FIGS. 9A to 9F are sectional views of a semiconductor device, consecutively showing the steps of a process for fabricating an interconnect pattern according to a first embodiment of the present invention.

A process according to a first embodiment of the present invention is consecutively shown by FIGS. 9A to 9F. In FIG. 9A, on an underlying insulator layer 32 such as made of $SiO_2$, a Ti/TiN film 34 including a 400-angstrom-thick Ti adhesion layer and a 300-angstrom-thick TiN barrier layer is deposited by sputtering at a temperature of 300° C., followed by deposition of a 5000-angstrom-thick Al—Cu alloy layer 36 thereon at a temperature of 300° C. The Al—Cu alloy layer 36 includes 99.5% Al and 0.5% Cu, for example.

Figure 9B:
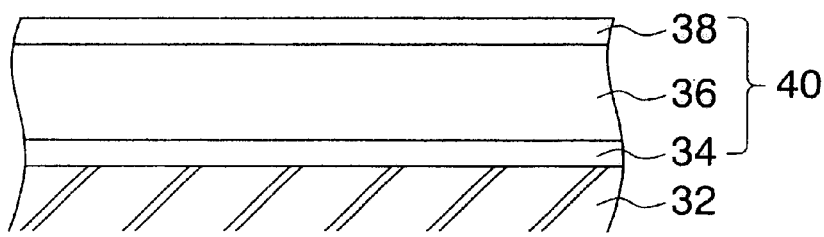

Subsequently, as shown in FIG. 9B, a TiN/Ti film 38 including a 500-angstrom-thick TiN barrier layer and a 250-angstrom-thick Ti adhesion layer is deposited on the Al—Cu alloy layer 36, thereby obtaining a combination interconnect layer 40 including the Ti/TiN film 34, the Al—Cu alloy layer 36 and the TiN/Ti film 38.

Figure 9C:
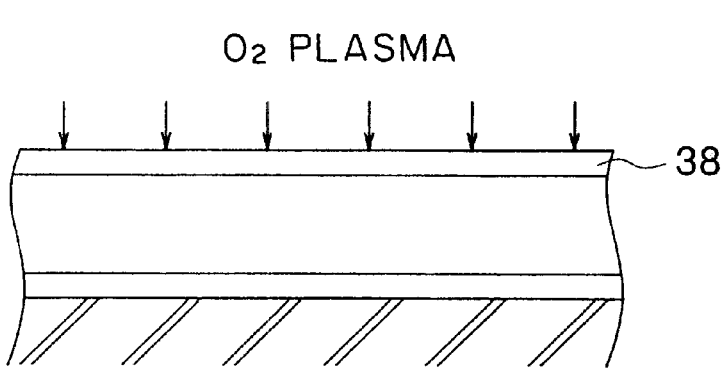

Subsequently, an $O_2$-plasma treatment is conducted in a plasma chamber as a pretreatment for patterning the interconnect layer, as shown in FIG. 9C. The $O_2$-plasma treatment uses the following conditions: ambient temperature at 1.1 Torr; $O_2$ flow rate at 3750 sccm; plasma power at 1000 watts; temperature at 250° C.; and time length for 45 seconds.

Figure 9D:
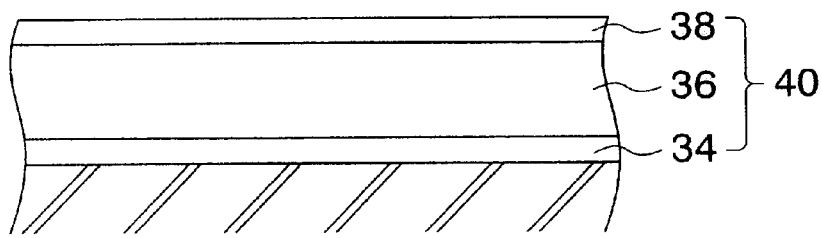

Thereafter, as shown in FIG. 9D, the temperature of the wafer stage mounting thereon the wafer having the interconnect layer 40 subjected to the pretreatment is raised up to 350° C. within the plasma chamber, to perform an Ar-annealing treatment for the wafer for ten minutes in the plasma chamber.

Figure 9E:
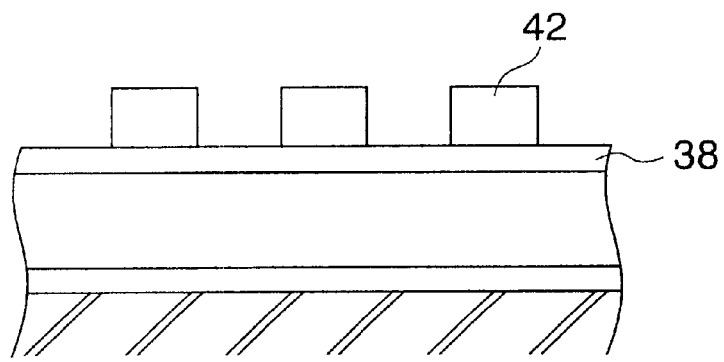

Subsequently, as shown in FIG. 9E, an etching mask 42 is formed on the TiN/Ti film 38 of the interconnect pattern by coating and subsequent patterning.

Figure 9F:
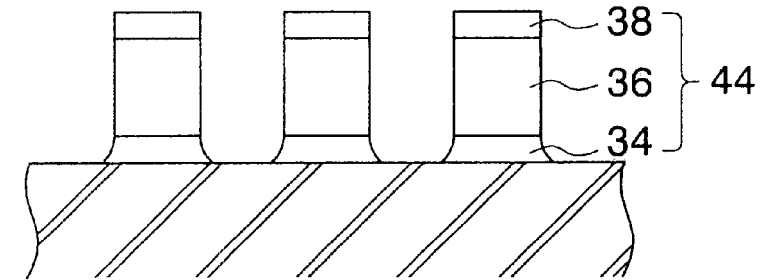

Thereafter, as shown in FIG. 9F, the interconnect layer 40 is patterned by a plasma-enhanced etching technique using the etching mask 42 to form an interconnect pattern including the Ti/TiN film 34, the Al—Cu alloy layer 36 and the TiN/Ti film 38 consecutively formed on the underlying insulator layer 32.

In the above embodiment, the Ar-annealing treatment at a temperature around 340° C. for ten minutes effectively redistributes the Cu particles segregated within the Al—Cu alloy layer 36 during the $O_2$-plasma treatment, thereby suppressing the occurrence of the short-circuit failure.

Figure 10A:
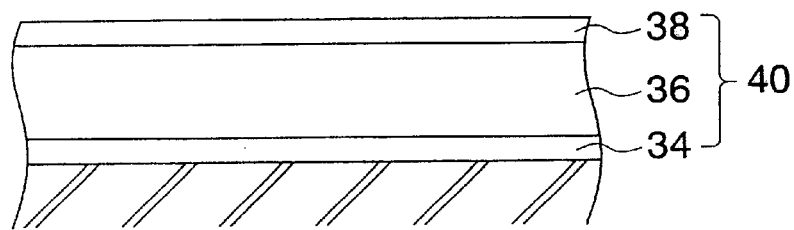
FIGS. 10A to 10C are sectional views of another semiconductor device, consecutively showing the steps of a process for fabricating an interconnect pattern according to a second embodiment of the present invention.
Figure 10B:
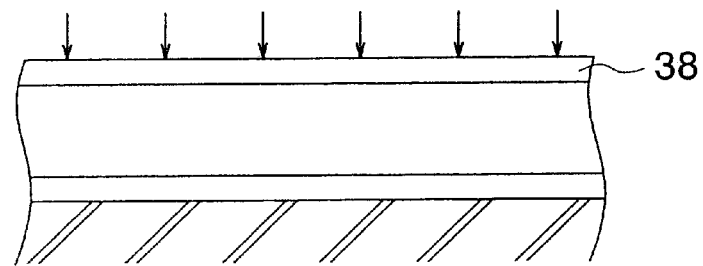
Figure 10C:
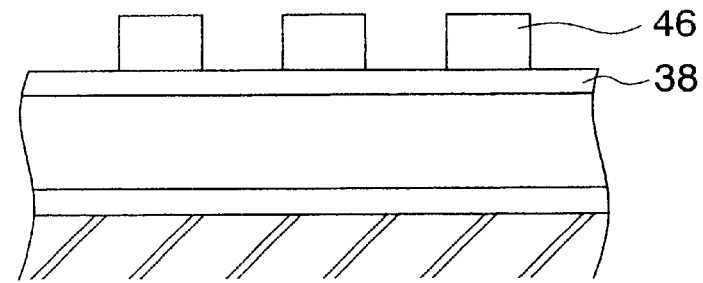

FIGS. 10A to 10C show a process according to a second embodiment of the present invention. The steps prior to the step of FIG. 10A are similar to the steps shown in FIGS. 9A to 9E, and thus the description thereof will be omitted here for avoiding a duplication.

If the etching mask 42 formed in the step of FIG. 9E has a misalignment, the etching mask 42 should be removed and another etching mask should be formed. For this purpose, the etching mask 42 is removed by an $O_2$-ashing step at a temperature of 200° C. or below in the present embodiment, to obtain the structure shown in FIG. 10A.

Thereafter, an $O_2$-plasma treatment at a temperature of 150° C. or below is conducted to the TiN/Ti film 38, as shown in FIG. 10B, followed by forming another etching mask 46 on the TiN/Ti film 38. If it is detected that the another etching mask has a misalignment with respect to the other masks or has some defect therein, iteration of removal and formation of another etching mask is performed to obtain an etching mask having no defect therein. The interconnection pattern is then patterned by a plasma etching technique using the etching mask having no defect.

In the present embodiment, the wafer is not subjected to the specific temperature, around 250° C., which causes segregation of Cu particles in the Al—Cu alloy, after the heat treatment at the temperature 150° C. or below. Thus, the Al—Cu alloy layer is free from the Cu segregation.

Since the above embodiments are described only for examples, the present invention is not limited to the above embodiments and various modifications or alterations can be easily made therefrom by those skilled in the art without departing from the scope of the present invention.

What is claimed is:

1. The method for forming an interconnect pattern comprising the consecutive steps of:

depositing an interconnect film on an underlying layer, said interconnect film including at least an Al—Cu alloy layer;

plasma treating said interconnect film;

heat-treating said interconnect film at a temperature between 280° C. and 400° C.; and patterning said interconnect film by using an etching mask to form the interconnect pattern, wherein said plasma treating is Ar-plasma treating at a temperature of 250° C. or lower.

2. The method as defined in claim 1, further comprising the consecutive steps of removing another etching mask by an ashing step at a temperature equal to or below 200° C., $O_2$-plasma treating said interconnect film at temperature equal to or below 150° C. and forming said etching mask.

3. The method as defined in claim 1, wherein said interconnect film further includes an adhesion layer and a barrier layer on each of top and bottom surfaces of Al—Cu alloy layer.

4. The method as defined in claim 3, wherein said adhesion layer and said barrier layer are a Ti layer and a TiN layer, respectively.

5. The method as defined in claim 1, wherein said plasma treating is $O_2$-plasma treating at a temperature higher than 200° C.

6. A method for forming an interconnect pattern comprising the consecutive steps of:

depositing an interconnect film on an underlying layer, said interconnect film including at least an Al—Cu alloy layer;

initial plasma treating said interconnect film;

heat-treating said interconnect film at a temperature between 280° C. and 400° C.;

forming an etching mask on said interconnect film;

testing said etching mask for misalignment or defect;

removing any defective or misaligned etching mask by an ashing step at a temperature equal to or below 200° C., $O_2$-plasma treating said interconnect film at temperature equal to or below 150° C. and forming another etching mask, and patterning said interconnect film by using said another etching mask to form the interconnect pattern.

7. The method as defined in claim 6, wherein said interconnect film further includes an adhesion layer and a barrier layer on each of top and bottom surfaces of said Al—Cu alloy layer.

8. The method as defined in claim 7, wherein said adhesion layer and said barrier layer are a Ti layer and a TiN layer, respectively.

9. The method as defined in claim 6, wherein said initial plasma treating is $O_2$-plasma treating at a temperature higher that 200° C.

10. The method as defined in claim 6, wherein said initial plasma treating is Ar-Plasma treating at a temperature of 250° C. or lower.

* * * * *